(12) United States Patent
Taguwa

(10) Patent No.: US 6,569,759 B2
(45) Date of Patent: May 27, 2003

(54) SEMICONDUCTOR DEVICE HAVING INTERCONNECTION IMPLEMENTED BY REFRACTORY METAL NITRIDE LAYER AND REFRACTORY METAL SILICIDE LAYER AND PROCESS OF FABRICATION THEREOF

(75) Inventor: Tetsuya Taguwa, Tokyo (JP)

(73) Assignee: NEC Electronics Corporation (JP)

( * ) Notice: Subject to any disclaimer, the term of this patent is extended or adjusted under 35 U.S.C. 154(b) by 0 days.

(21) Appl. No.: 10/074,936

(22) Filed: Feb. 13, 2002

(65) Prior Publication Data

US 2002/0070456 A1 Jun. 13, 2002

Related U.S. Application Data

(62) Division of application No. 09/496,376, filed on Feb. 2, 2000, now Pat. No. 6,404,058.

(30) Foreign Application Priority Data

Feb. 5, 1999 (JP) .............................................. 11-28370

(51) Int. Cl.⁷ ............................................. H01L 2/4763
(52) U.S. Cl. ....................... 438/629; 438/625; 438/627; 438/630; 438/648; 438/655
(58) Field of Search ................................ 438/630, 649, 438/655, 682, 683, 651, 581, 582, 648, 650, 656, 580, 629, 627, 626, 625

(56) References Cited

U.S. PATENT DOCUMENTS

| | | | | |
|---|---|---|---|---|
| 5,525,543 A | * | 6/1996 | Chen | 148/DIG. 19 |
| 5,672,543 A | * | 9/1997 | Chang et al. | 438/643 |
| 6,221,770 B1 | * | 4/2001 | Hillman et al. | 438/622 |
| 2002/0043722 A1 | * | 4/2002 | Taguwa | 257/758 |

FOREIGN PATENT DOCUMENTS

JP   10-209278   *   8/1998

* cited by examiner

*Primary Examiner*—Carl Whitehead, Jr.
*Assistant Examiner*—Thanhha S. Pham
(74) *Attorney, Agent, or Firm*—Hayes Soloway P.C.

(57) ABSTRACT

A semiconductor integrated circuit device is implemented by circuit components and a multi-layered wiring structure, and titanium nitride is used for a part of the integrated circuit such as a conductive plug, an accumulating electrode and a conductive line, wherein the titanium nitride layer is laminated on a titanium silicide layer so as to absorb thermal stress due to the titanium nitride layer.

11 Claims, 6 Drawing Sheets

SEMICONDUCTOR DEVICE HAVING INTERCONNECTION IMPLEMENTED BY REFRACTORY METAL NITRIDE LAYER AND REFRACTORY METAL SILICIDE LAYER AND PROCESS OF FABRICATION THEREOF

This application is a divisional application of U.S. application Ser. No. 09/496,376 filed Feb. 2, 2000, now U.S. Pat. No. 6,404,058.

FIELD OF THE INVENTION

This invention relates to a semiconductor device and, more particularly, to a semiconductor device having interconnections and a process for fabricating it.

DESCRIPTION OF THE RELATED ART

Semiconductor manufacturers have progressively increased component elements integrated on a semiconductor substrate. Manufacturers are fabricating the component elements on the semiconductor element. Various patterns are transferred during the fabrication process to semiconductor/insulating layers forming a multiple-layered structure on the semiconductor substrate, and contact holes in the inter-layered insulating layers. These contact holes are miniaturized together with the component elements and, accordingly, have a large aspect ratio, i.e., the ratio of the depth to the diameter. The contact holes are filled with conductive material during the deposition for upper wirings, and the upper conductive lines are electrically connected to the lower conductive lines through the conductive material in the contact holes. Thus, the conductive lines are connected between the component elements on the different levels, and the component elements form an integrated circuit.

Aluminum is popular with semiconductor manufacturers as the conductive material. The aluminum is deposited through sputtering, and the aluminum layer is patterned to the conductive lines through photo-lithography and etching. However, the aluminum is poor in step coverage, and the poor step coverage is the cause of disconnection due to its large resistance. Even if the aluminum layer is patterned to the conductive lines without disconnection, the conductive lines are less durable. Namely, the conductive lines are exposed to the electro-migration, where the step coverage is poor, and are liable to be disconnected.

One of the approaches against the poor step coverage is the formation of contact plugs in the contact holes. A typical example of the material used for a contact plug is tungsten. The tungsten plugs are formed as follows. First, contact holes are formed in an inter-layered insulating layer, and barrier metal layers are formed on the inner surfaces of the contact holes. A titanium layer and a titanium nitride layer are formed in combination with the barrier metal layer, and the titanium and the titanium nitride are deposited by using sputtering techniques. The titanium layer lowers the contact resistance seen by a lower semiconductor layer. On the other hand, the titanium nitride layer enhances the adhesion between the titanium layer and a tungsten plug, and prevents the lower semiconductor layer from diffusing the tungsten. The barrier metal layer defines a recess in the contact hole, and tungsten is deposited by using a chemical vapor deposition, which provides good step coverage. The tungsten fills the recess, and swells into a tungsten layer over the inter-layered insulating layer. The tungsten layer is uniformly etched without any mask, and a tungsten plug is left in the recess.

Although the tungsten plug fairly improves the step coverage, the titanium layer and the titanium nitride layer deposited to target thickness in miniature contact holes required for an ultra large-scale integration. If the titanium/titanium nitride layers do not have the target thickness, the contact resistance is increased, and/or the tungsten damages the component elements in the lower semiconductor layer.

In order to exactly control the titanium layer and the titanium nitride layer, a chemical vapor deposition is desirable. A chemical vapor deposition using a thermal reaction is the most appropriate especially for the titanium nitride layer from the view point of the step coverage, and is widely used for the barrier metal layer. Thus, the titanium, the titanium nitride and the tungsten are respectively deposited by using the three chemical vapor deposition techniques. However, the prior art process' sequence is complicated, and the tungsten is costly. This results in increase of the production cost.

It is proposed to fill the recess with the titanium nitride deposited through the chemical vapor deposition technique. The tungsten plug is eliminated from the interconnection, because the titanium nitride forms fairly good step coverage.

FIGS. 1A to 1D show the prior art process. The prior art process starts with preparation of a silicon substrate 501 where a field oxide layer (not shown) is selectively grown. Silicon oxide or boro-phosphosilicate glass is deposited to 1.5 microns thick by using a chemical vapor deposition, and forms an inter-layered insulating layer 502. A photo-resist etching mask (not shown) is formed on the inter-layered insulating layer 502 by using the photo-lithography, and the inter-layered insulating layer 502 is selectively etched by using a dry etching. Then, a contact hole 503 is formed in the inter-layered insulating layer 502 as shown in FIG. 1A, and is 0.4 micron in diameter.

Subsequently, titanium is deposited over the entire surface of the resultant structure to thickness between 5 and 20 nanometers by using a plasma-assisted chemical vapor deposition. This forms a titanium layer 504. The titanium layer 504 conformably extends, and defines a recess in the contact hole 503. Titanium nitride is deposited over the entire surface of the resultant structure by using a thermal chemical vapor deposition. The titanium nitride fills the recess, and swells into a titanium nitride layer 505 of 0.4 micron thick. Thus, the contact hole 503 is perfectly filled with the titanium and the titanium nitride as shown in FIG. 1B.

Subsequently, the titanium nitride layer 505 and the titanium layer 504 are etched without any mask until the inter-layered insulating layer 502 is exposed again. Chlorine-containing etching gas is used in the dry etching. As a result, a titanium layer 504a and a piece of titanium nitride are left in the contact hole 503 as shown in FIG. 1C, and serve as a conductive plug.

Aluminum alloy is deposited over the entire surface of the resultant structure by using sputtering, and forms an aluminum alloy layer. A photo-resist etching mask (not shown) is formed through the photo-lithography, and the aluminum alloy layer is selectively etched away by using a dry etching technique. An aluminum alloy strip 506 is formed on the inter-layered insulating layer 502 as shown in FIG. 1D.

Thus, the conductive plug is formed from the titanium layer 504 and the titanium nitride layer 505, and no tungsten is used for the conductive plug. This results in reduction in production cost. However, the above-described prior art process results in low production yield.

The present inventor investigated the defective products fabricated through the prior art process. The defective products were grouped into three classes. The first class had been rejected due to damage of the inter-layered insulating layer 502. The second class had been rejected due to contaminant, and the third class had been rejected due to leakage current flowing into the silicon substrate 501 or impurity regions formed in the silicon substrate 501.

In the defective products grouped in the first class, the inter-layered insulating layers 502 were violently etched during the dry etching for patterning the titanium layer 504. The present inventor observed the titanium nitride layer 505, and found many cracks therein and separation between the titanium nitride layer 505 and the titanium layer 504. The present inventor assumed that the inter-layered insulating layer 502 had been attacked by the etchant penetrating through the cracks and the gap between the titanium layer 504 and the titanium nitride layer 505.

In the defective products grouped into the second class, the contaminant was pieces of titanium nitride. The pieces of titanium nitride were assumed to be produced from the titanium nitride layer 505 due to the cracks and the separation.

In the defective products grouped into the third class, the silicon substrate 501 and the impurity regions were damaged by the etchant, and the titanium nitride layer 505 was also cracked and separated from the titanium layer 504.

Thus, all the defective products were derived from the cracks and the separation of the titanium nitride layer 505. The present inventor further investigated the titanium nitride layer 505, and found that the cracks and the separation were derived from large thermal stress exerted on the titanium nitride layer 505 and relatively small adhesion of the titanium nitride. In order to obtain good step coverage, it was necessary to deposit the titanium nitride to a large thickness at high temperature ambience. When the titanium nitride layer 505 was cooled to room temperature, a large tensile stress was exerted on the titanium nitride layer 505 due to the difference in thermal expansion coefficient between the titanium and the titanium nitride. The tensile stress was equal to or greater than 2.5 GPa. Moreover, the titanium nitride was less adhesive to the titanium. The large thermal stress was the cause of the separation and the cracks. The etchant had penetrated through the cracks and the gap, and damaged the inter-layered insulating layer 502 and the silicon substrate 501.

SUMMARY OF THE INVENTION

It is therefore an important object of the present invention to provide a process for fabricating a semiconductor device that is improved in production yield.

To accomplish the object, the present invention proposes to absorb the thermal stress by using a refractory metal silicide.

In accordance with one aspect of the present invention, there is provided a semiconductor device comprising a semiconductor substrate, at least one circuit component fabricated on the semiconductor substrate, an inter-layered insulating structure formed on the semiconductor substrate and a wiring structure connected to the at least of the aforesaid one circuit components, and at least one of the aforesaid circuit components and the wiring structure having a multi-layered structure including a refractory metal silicide and a refractory metal nitride laminated on each other.

In accordance with another aspect of the present invention, there is provided a process for fabricating a semiconductor device comprising the steps of a) preparing a semiconductor substrate, b) forming an inter-layered insulating layer over the semiconductor substrate, c) forming a hole in the inter-layered insulating layer, and d) forming a multi-layered conductive structure including a first refractory metal silicide layer and a first refractory metal nitride layer laminated on each other in the hole by using a chemical vapor deposition.

In accordance with yet another aspect of the present invention, there is provided a process for fabricating a semiconductor device, comprising the steps of a) preparing a semiconductor substrate, b) forming an inter-layered insulating layer over the semiconductor substrate, and c) forming a multilayered conductive structure including a first refractory metal silicide layer and a first refractory metal nitride layer laminated on each other on the inter-layered insulating layer by using a chemical vapor deposition.

BRIEF DESCRIPTION OF THE DRAWINGS

The features and advantages of the process will be more clearly understood from the following description taken in conjunction with the accompanying drawings in which.

DESCRIPTION OF THE PREFERRED EMBODIMENTS

First Embodiment

Figure 1A:
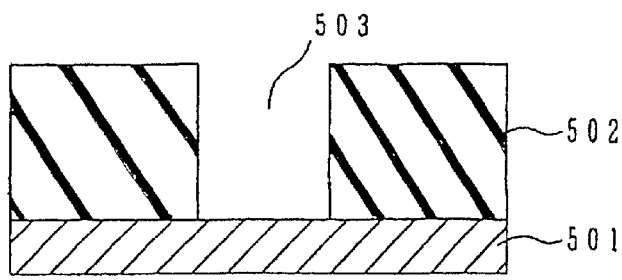
FIGS. 1A to 1D are cross sectional views showing the prior art process.
Figure 1B:
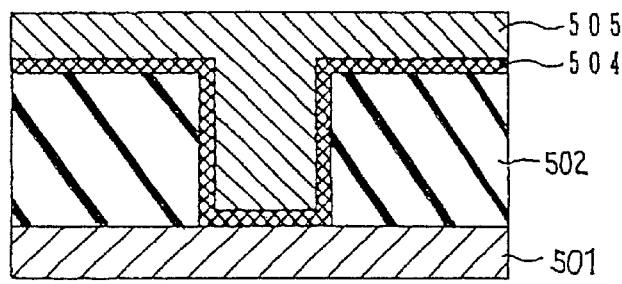
Figure 1C:
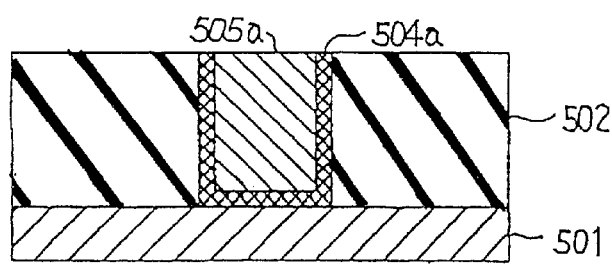
Figure 1D:
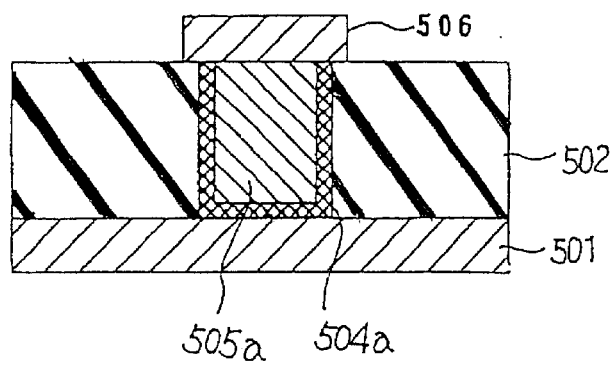

FIGS. 2A to 2F show a process for fabricating a semiconductor device embodying the present invention. The process starts with preparation of a silicon substrate 101 where an isolating oxide layer (not shown) is selectively grown. Though not shown in the drawings, the isolating oxide layer defines plural active regions in the major surface of the silicon substrate 101, and circuit components are fabricated on the plural active regions. The circuit components form an integrated circuit together with a multi-layered wiring structure.

Figure 2A:
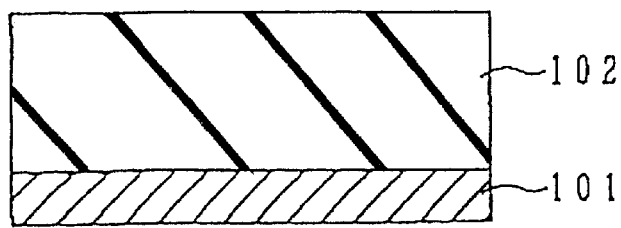
FIGS. 2A to 2F are cross sectional views showing a process for fabricating a semiconductor device according to the present invention.

Boro-phosphosilicate glass is deposited over the entire surface of the silicon substrate 101 by using a chemical vapor deposition, and forms an inter-layered insulating layer 102 of 2.5 microns thick as shown in FIG. 2A.

Photo-resist solution is spread over the inter-layered insulating layer 102, and is baked forming a photo-resist layer. A pattern image for contact holes is transferred to the photo-resist layer, and forms a latent image in the photo-resist layer. The latent image is developed, and the photo-resist layer is formed into a photo-resist etching mask 103. Holes are formed in the photo-resist etching mask 103, and are 0.4 micron in diameter. Thus, the photo-resist etching mask 103 is formed through a photo-lithography.

Figure 2B:
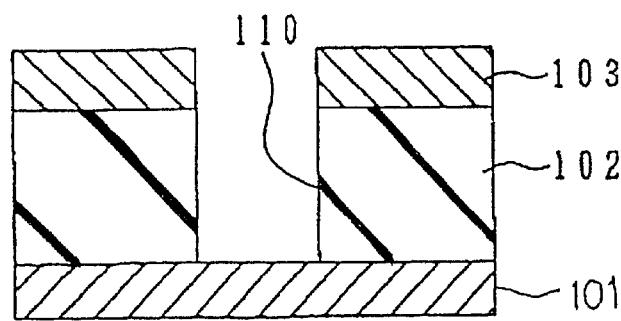

Using the photo-resist etching mask 103, the inter-layered insulating layer 102 is selectively etched by using a dry etching technique, and the etching gas contains $CHF_3$ and CO. The photo-resist etching mask 103 selectively exposes the inter-layered insulating layer 102 to the etching gas, and contact holes 110 are formed in the inter-layered insulating layer 102. One of the contact holes 110 is shown in FIG. 2B, and the description is focused on the contact hole 110.

Figure 2C:
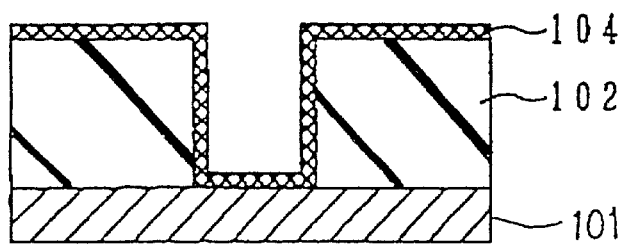

The photo-resist etching mask 103 is stripped off. Titanium is deposited over the entire surface of the resultant structure by using a plasma-assisted chemical vapor deposition, and forms a titanium layer 104 of 10 nanometers thick. In detail, the resultant structure is placed on a susceptor provided in a reaction chamber of a reactant (not shown), and is opposite to an electrode. The air is evacuated from the reaction chamber, and the wafer temperature is regulated to 500 degrees centigrade or higher. Reactant gas is introduced into the reaction chamber, and the reaction chamber is maintained at 1 to 200 torr. The reactant gas used in the chemical vapor deposition contains $TiCl_4$ at 5 to 20 sccm and Ar at 100 to 2000 sccm. $TiCl_4$ is reduced so as to deposit the titanium. The electrode is applied with rf electric power of hundreds watts. Then, a plasma is generated in the reaction chamber, and titanium is deposited over the entire surface of the resultant structure. The titanium layer 104 conformably extends over the entire surface, and defines a recess as shown in FIG. 2C.

Subsequently, titanium silicide is deposited over the titanium layer 104 by using a plasma-assisted chemical vapor deposition technique, and forms a titanium silicide layer 105 of 10 to 20 nanometers thick. The deposition of the titanium silicide layer 105 is carried out under the following conditions. The reactant gas contains $TiCl_4$ at 5 to 20 sccm, Ar at 100 to 2000 sccm, $H_2$ at 1000 to 5000 sccm and $SiH_4$ at 10 to 50 sccm. The wafer temperature is 400 degrees centigrade or higher, and the reaction chamber is maintained at 1 to 20 torr. The rf electric power is supplied at hundreds of watts to the electrode.

Subsequently, titanium nitride TiN is deposited over the titanium silicide layer 105 by using a chemical vapor deposition technique, and forms a titanium nitride layer 106 of 120 nanometers thick. The deposition of the titanium nitride is carried out under the following conditions. The reactant gas contains $TiCl_4$ at 30 to 50 sccm, $NH_3$ at 40 to 70 sccm and $N_2$ at 30 to 50 sccm. The wafer temperature is of the order of 600 degrees in centigrade, and the reaction chamber is maintained at 15 to 30 torr. The higher the deposition temperature, the better the step coverage. For this reason, the titanium nitride may be deposited at a temperature greater than 600 degrees centigrade. Although the thermal stress is increased in the high-temperature deposition, the titanium silicide layer 105 takes up the thermal stress, and prevents the titanium nitride layer 106 from cracking and separation.

Subsequently, titanium silicide is deposited over the titanium nitride layer 107 by using the plasma-assisted chemical vapor deposition technique, and forms a titanium silicide layer 107 of 10 nanometers thick. The deposition conditions for the titanium silicide layer 107 are similar to those of the titanium silicide layer 105.

Figure 2D:
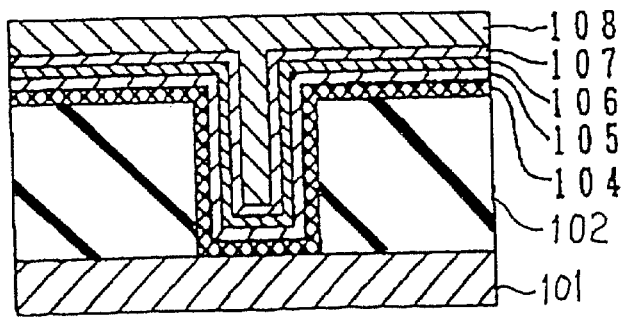

Subsequently, titanium nitride is deposited over the titanium silicide layer 107 by using the chemical vapor deposition technique, and forms a titanium nitride layer 108 of 120 nanometers thick. The deposition conditions for the titanium nitride layer 108 are similar to those of the titanium nitride layer 106. The titanium layer 104, the titanium silicide layer 105, the titanium nitride layer 106 and the titanium suicide layer 197 are so thin that a recess is still left in the contact hole 110. The titanium nitride fills the recess, and swells into the titanium nitride layer 108 over the inter-layered insulating layer 102 as shown in FIG. 2D.

If the contact hole 110 has a large diameter, the deposition of titanium silicide and the deposition of titanium nitride are repeated. The titanium silicide layers and the titanium nitride layers make the contact hole 110 narrow enough to be filled with the titanium nitride 108.

Figure 2E:
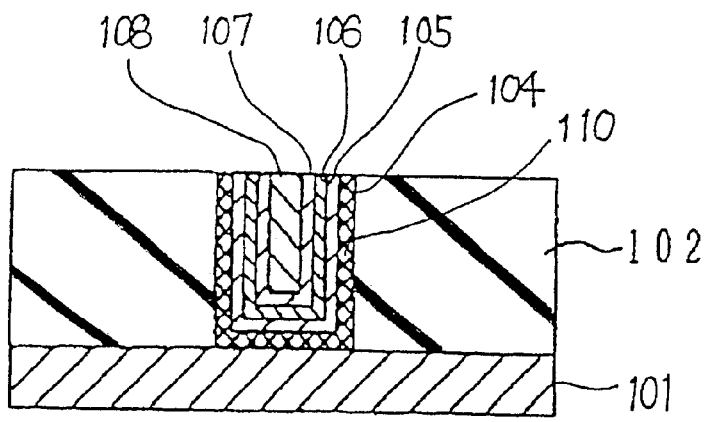

The titanium nitride layer 108, the titanium silicide layer 107, the titanium nitride layer 106, the titanium silicide layer 105 and the titanium layer 104 are etched withoutany mask by using chlorine-containing gas until the inter-layered insulating layer 102 is exposed, again. As a result, a conductive plug 104/105/106/107/108 fills the contact hole 110 as shown in FIG. 2E.

Figure 2F:
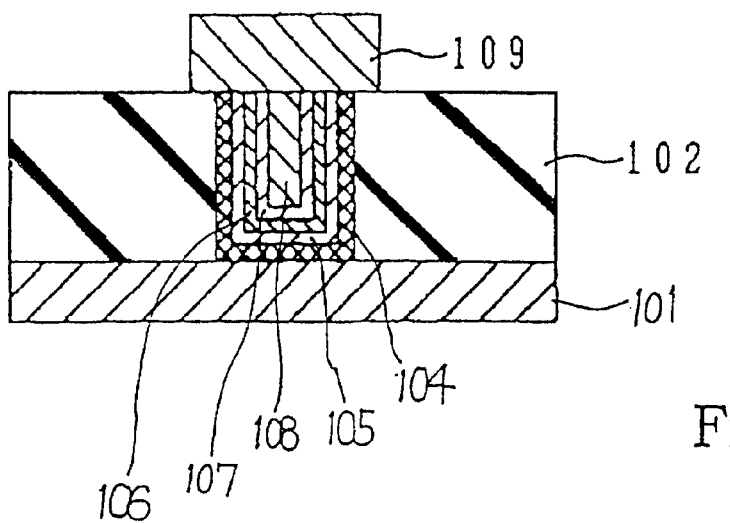

Subsequently, aluminum alloy is deposited over the entire surface of the resultant structure, and forms an aluminum alloy layer of 0.3 micron to 1.0 micron thick. A photo-resist etching mask (not shown) is formed on the aluminum alloy layer through the photo-lithography, and the aluminum alloy layer is selectively etched by using a dry etching technique. Thus, the aluminum alloy layer is patterned into an aluminum alloy strip 109, which is held in contact with the conductive plug 104/105/106/107/108 as shown in FIG. 2F. The aluminum alloy strip 109 and the conductive plug 104 to 108 form parts of the multi-layered wiring structure.

As understood from the foregoing description, the titanium silicide layers 105/107 are formed between the titanium layer 104 and the titanium nitride layer 106 and the titanium nitride layers 106 and 108. Because the titanium silicide layers 105/107 absorb the thermal stress due to the titanium nitride layers 106/108, the titanium nitride layers 106/108 are deposited in the high temperature ambience, and the step coverage is improved through the high-temperature deposition. The titanium nitride layers 106/108 have fewer cracks and are not separated by the reduction of thermal stress. Moreover, the adhesion between the titanium silicide layers 105/107 and both titanium and titanium nitride layers 104/106/108 is greater than the adhesion between the titanium nitride layer and the titanium layer. As a result, the etching gas hardly penetrates through the titanium nitride layers 106/108, and, accordingly, the titanium nitride layers 106/108 effectively prevent the inter-layered insulating layer 102 and the silicon substrate 101 from the etching gas. The titanium nitride layer 108 does not serve as a source of contaminant. Thus, the production yield is improved by virtue of the titanium silicide layers 105/107.

Second Embodiment

FIGS. 3A to 3E show another process for fabricating a semiconductor device embodying the present invention. Many circuit components are fabricated on a p-type silicon substrate 201, and form an integrated circuit together with a multi-layered wiring structure. The present invention is focused on the accumulating electrode of a capacitor, which is one of the circuit components.

The process starts with preparation of the p-type silicon substrate 201. Silicon oxide is selectively grown on the major surface of the p-type silicon substrate 201, and the silicon oxide serves as a field oxide layer 202. The field oxide layer 202 defines the active regions. The description is focused on one of the active regions. The active region is thermally oxidized, and gate insulating layers are formed in the active region. Word lines 206 are patterned, and parts of the word lines 206 on the gate insulating layers serve as gate electrodes. Using the word lines 206 as an ion-implantation mask, an n-type dopant impurity is introduced into the active region, and forms n-type source/drain regions 203.

Insulating material is deposited over the entire surface of the resultant structure, and forms a lower inter-layered insulating layer. A contact hole is formed in the lower inter-layered insulating layer by using the photo-lithography and a dry etching technique, and the contact hole is filled with a conductive plug 207 of polysilicon. The conductive plug 207 is held in contact with one of the n-type source/drain regions 203. Conductive material is deposited over the entire surface of the lower inter-layered insulating layer, and the conductive material layer is patterned into a bit line 208. The bit line 208 is held in contact with the conductive plug 207.

Figure 3A:
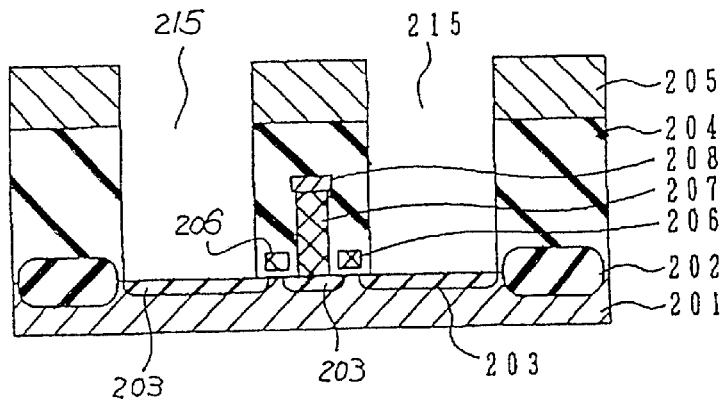
FIGS. 3A to 3E are cross sectional views showing another process for fabricating a semiconductor device according to the present invention.

Boro-phosphosilicate glass is deposited over the entire surface of the resultant structure, and forms an upper interlayered insulating layer 204. Using the photo-lithography and the dry etching technique, the upper interlayered insulating layer 204 and the lower inter-layered insulating layer are selectively etched away, and contact holes 215 are formed therein as shown in FIG. 3A. The contact holes 215 are 0.2 micron in diameter and 1.0 micron in depth. The thin silicon oxide layers on the n-type source/drain regions 203 are exposed to the contact holes 215, respectively.

The photo-resist etching mask is stripped off, and the thin silicon oxide layers are etched away by using a wet etching technique. Buffered hydrofluoric acid is used in the wet etching, and contains hydrofluoric acid at 1 percent. The n-type source/drain regions 203 are exposed to the contact holes 215, respectively.

Figure 3B:
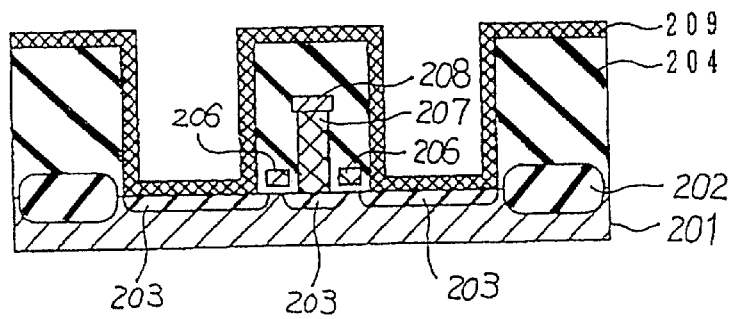

Subsequently, titanium is deposited over the entire surface of the resultant structure by using the plasma-assisted chemical vapor deposition, and forms a titanium layer 209 of 10 nanometers thick. The titanium layer 209 conformably extends as shown in FIG. 3B.

Figure 3C:
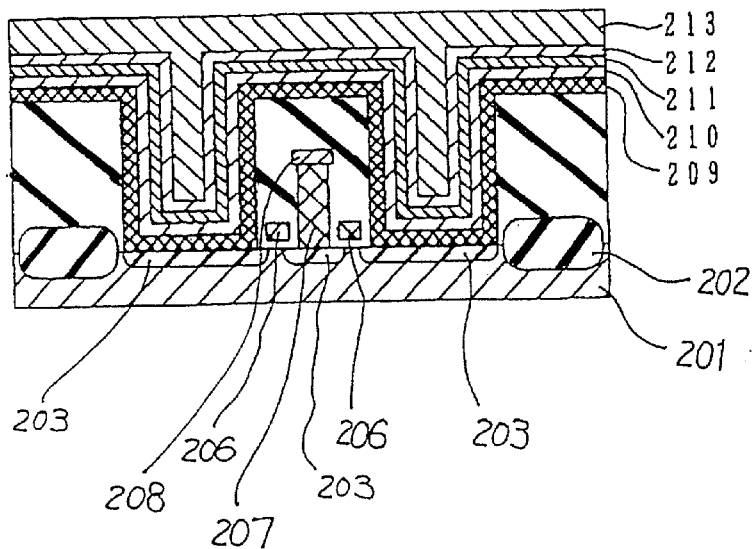

Subsequently, titanium silicide is deposited over the titanium layer 209, and forms a titanium silicide layer 210 of 20 nanometers thick. Titanium nitride is deposited over the titanium silicide layer 210, and forms a titanium nitride layer 211 of 200 nanometers thick. Titanium silicide is deposited over the titanium nitride layer 211, and forms a titanium silicide layer 212 of 10 nanometers thick. Finally, titanium nitride is deposited over the titanium silicide layer 212. The titanium nitride fills the recess defined by the titanium silicide layer 212, and swells into a titanium nitride layer 213 of 500 nanometers thick as shown in FIG. 3C.

The deposition conditions of these layers 210, 211, 212 and 213 are similar to those of the first embodiment. If the contact holes 215 are wide, the deposition of titanium silicide and the deposition of titanium nitride are repeated so as to make the recess narrower.

Figure 3D:
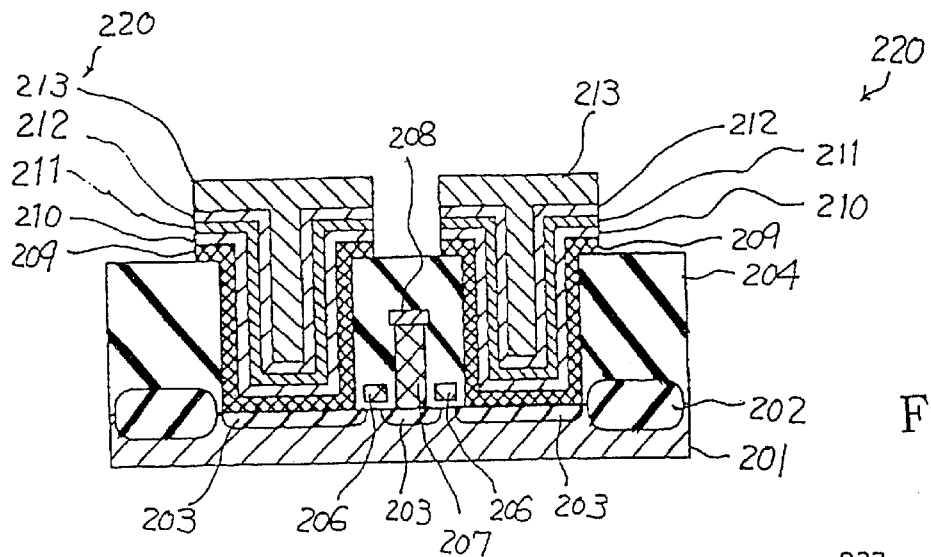

Subsequently, a photo-resist etching mask is patterned on the titanium nitride layer 213 by using the photo-lithography, and the layers 209 to 213 are selectively etched away by using a dry etching technique. The titanium nitride layer 213, the titanium silicide layer 212, the titanium nitride layer 211, the titanium silicide layer 210 and the titanium layer 209 are patterned into accumulating electrodes 220 as shown in FIG. 3D.

Subsequently, tantalum oxide $Ta_2O_5$ is deposited over the entire surface of the resultant structure by using a chemical vapor deposition, and forms a tantalum oxide layer 214 of 10 nanometers thick. The deposition conditions are as follows: Reactant gas contains ethoxy tantalum and oxygen, and the reaction chamber is maintained at 1 torr. The substrate temperature is of the order of 450 degrees centigrade.

Figure 3E:
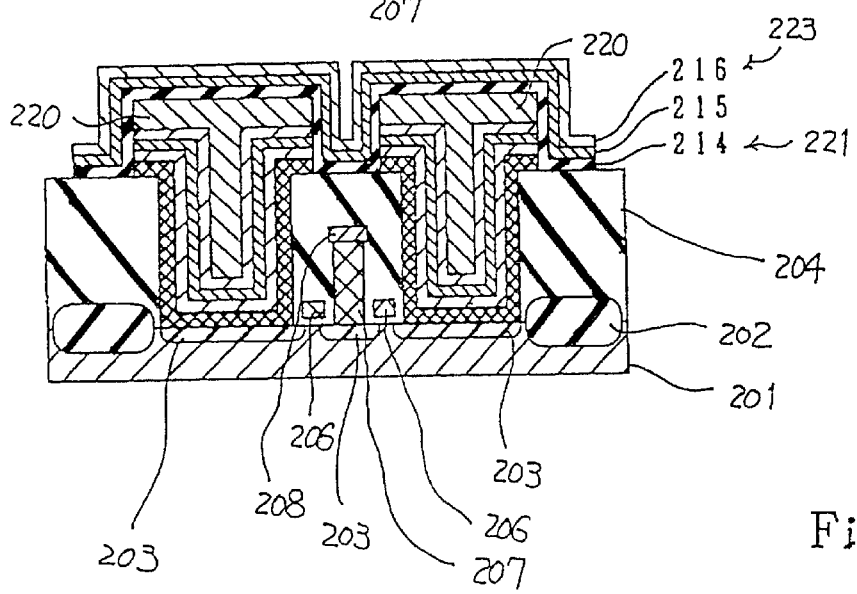

Subsequently, titanium nitride is deposited over the tantalum oxide layer 214 by using a sputtering, and forms a titanium nitride layer 215 of 20 nanometers thick. Finally, tungsten silicide is deposited over the titanium nitride layer 215 by using sputtering, and forms a tungsten silicide layer 216 of 100 nanometers thick. A photo-resist etching mask is formed on the tungsten silicide layer 216, and the tantalum oxide layer 214, the titanium nitride layer 215 and the tungsten silicide layer 216 are patterned into a dielectric layer 221 and a counter electrode 223 as shown in FIG. 3E.

The titanium silicide layers 210/212 are formed under the titanium nitride layers 211/213, and absorb the thermal stress. The titanium nitride layers 211/213 are deposited in high-temperature ambience, and the step coverage is improved. The titanium nitride layers 211/213 are not cracked nor separated from the other layers. Thus, the titanium nitride layers 210/212 are effective against the cracks and the separation due to the thermal stress.

In the second embodiment, the titanium silicide layer 210 may be overlain by the titanium nitride layer 211.

Third Embodiment

Figure 4A:
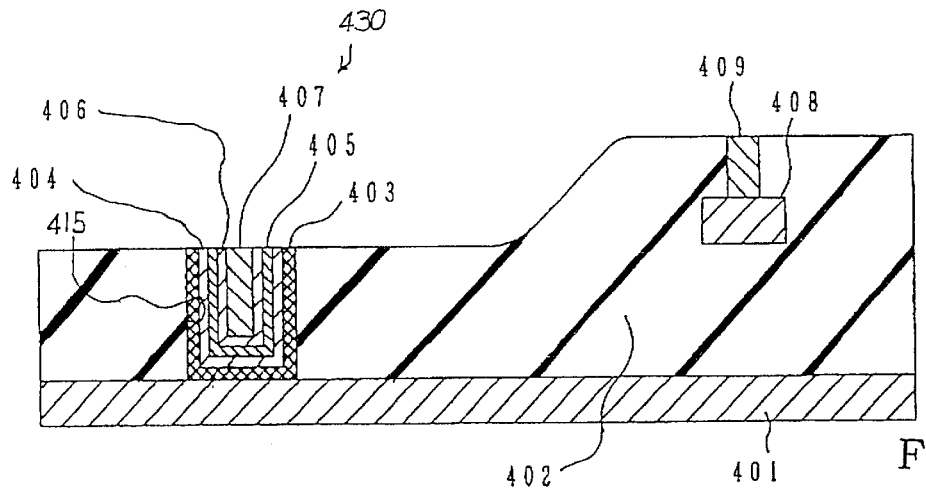
FIGS. 4A to 4C are cross sectional views showing yet another process for fabricating a semiconductor device according to the present invention.
Figure 4B:
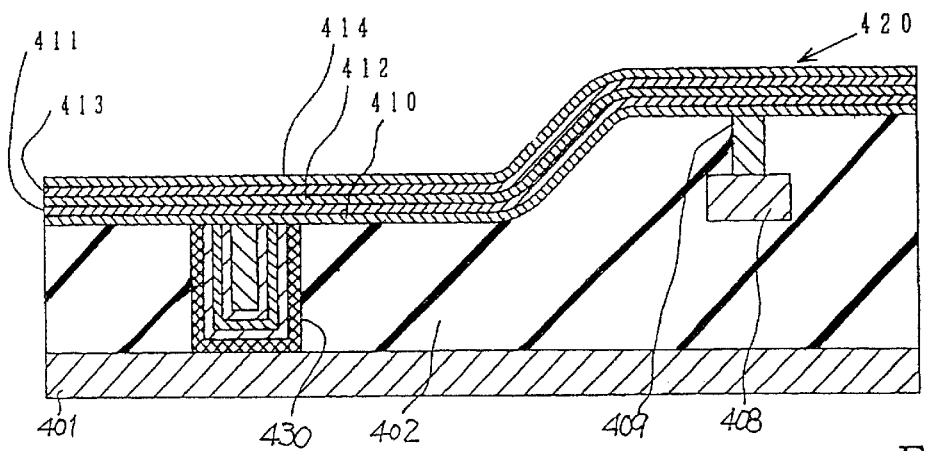
Figure 4C:
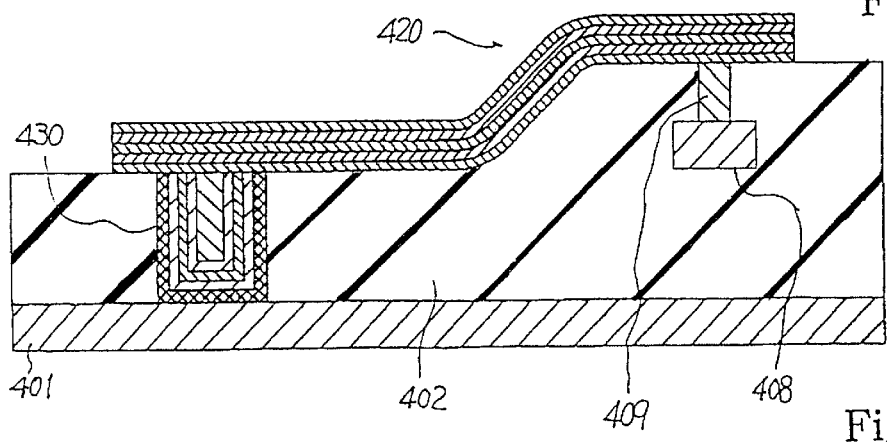

FIGS. 4A to 4C shows yet another process for fabricating a semiconductor device embodying the present invention. Many circuit components are fabricated on a silicon substrate 401, and form an integrated circuit together with a multi-layered wiring structure. In this instance, the present invention is further applied to a conductive strip forming a part of the multilayered wiring structure.

The process starts with preparation of the silicon substrate 401. Though not shown in the figures, the circuit components are fabricated on the silicon substrate 401. Boro-phosphosilicate glass is deposited by using the chemical vapor deposition, and forms an inter-layered insulating layer 402. Reference numerals 408 and 409 designate a bit line and a titanium nitride plug, respectively.

A wide step is formed in the inter-layered insulating layer 402, and a contact hole 415 is formed in the inter-layered insulating layer 402. A conductive plug 430 is formed in the contact hole 415. The conductive plug 430 includes a titanium layer 403, a titanium silicide layer 404, a titanium nitride layer 405, a titanium silicide layer 406 and a titanium nitride layer 407 as shown in FIG. 4A. These layers 403 to 407 are formed as similar to the conductive plug 104/105/106/107/108.

Subsequently, titanium nitride is deposited over the inter-layered insulating layer 402, and forms a titanium nitride layer 410 of 80 nanometers thick. Titanium silicide is deposited over the titanium nitride layer 410, and forms a titanium silicide layer 411 of 10 nanometers thick. Titanium nitride is deposited over the titanium silicide layer 411, and forms a titanium nitride layer 412 of 80 nanometers thick. Titanium suicide is deposited over the titanium nitride layer 412, and forms a titanium silicide layer 413 of 10 nanometers thick. Titanium nitride is deposited over the titanium silicide layer 413, and forms a titanium nitride layer 414 of 80 nanometers thick. Thus, a laminated structure 410 to 414 is formed on the inter-layered insulating layer 402, and the total thickness is of the order of 2.5 microns. The deposition conditions of these layers 410/411/412/413/414 are similar to those of the first embodiment. The resultant structure is shown in FIG. 4B.

A photo-resist etching mask is patterned on the titanium nitride layer 414 by using the photo-lithography, and the laminated structure 410 to 414 is selectively etched away by using a dry etching technique. As a result, a conductive strip 420 is left on the inter-layered insulating layer 402 as shown in FIG. 4C. The conductive strip 420 is held in contact with the conductive plug 430.

The titanium silicide layers 411/413 absorb the thermal stress, and allow the manufacturer to form the thick titanium nitride layers 412/414 at the high-temperature ambience. Even though the manufacturer deposits the thick titanium nitride layers 412/414, the titanium silicide layers 411/413 prevent the titanium nitride layers 412/414 from cracking and separation, and the titanium nitride layers 412/414 conformably extend over the wide step. As a result, the production yield is improved, and the reliability is improved.

In the third embodiment, the titanium nitride layer and the titanium silicide layer may be exchanged with one another.

Although particular embodiments of the present invention have been shown and described, it will be apparent to those skilled in the art that various changes and modifications may be made without departing from the spirit and scope of the present invention.

For example, the titanium silicide layer may be laminated on the titanium nitride layer deposited on the titariium layer. The combination may be repeated more than once.

In the third embodiment, the conductive plug may be formed of conductive material such as polysilicon.

In the above-described embodiments, titanium, titanium silicide and titanium nitride are used for the conductive plug and/or the conductive strip. The present invention is not limited to the titanium, the titanium silicide and the titanium nitride. Other kinds of refractory metals, refractory metal silicides and refractory metal nitrides are usable in the present invention.

What is claimed is:

1. A process for fabricating a semiconductor device, comprising the steps of:
   a) preparing a semiconductor substrate;
   b) forming an inter-layered insulating layer over said semiconductor substrate;
   c) forming a hole in said inter-layered insulating layer; and
   d) forming a multi-layered conductive structure including a first refractory metal silicide layer and a first refractory metal nitride layer laminated on each other in said hole by using a chemical vapor deposition,
   wherein said step d) includes the sub-steps of
      d-1) conformably forming a refractory metal layer on an inner surface defining said hole,
      d-2) conformably forming said first refractory metal silicide layer on said refractory metal layer,
      d-3) conformably forming said first refractory metal nitride layer on said first refractory metal silicide layer,
      d-4) conformably forming a second refractory metal silicide layer on said first refractory metal nitride layer by using a chemical vapor deposition with the unfilled portion of said hole creating a recess, and
      d-5) filling said recess with a second refractory metal nitride layer by using a chemical vapor deposition.

2. The process as set forth in claim 1, in which said first refractory metal silicide is deposited at a first temperature, and said first refractory metal nitride is deposited at a second temperature higher than said first temperature.

3. The process as set forth in claim 1, in which said first refractory metal nitride layer and said refractory metal nitride layer are deposited at respective temperatures higher than deposited temperatures for said first refractory metal silicide layer and said second refractory metal silicide layer, respectively.

4. The process as set forth in claim 1, in which $TiCl_4$ is reduced for depositing said refractory metal layer in said sub-step d-1).

5. The process as set forth in claim 1, in which $TiCl_4$ reacts with one of ammonia and nitrogen in said step d-3) for depositing said first refractory metal nitride layer.

6. A process for fabricating a semiconductor device, comprising the steps of:
   a) preparing a semiconductor substrate;
   b) forming an inter-layered insulating layer over said semiconductor substrate and forming a hole in said inter-layered insulating layer;
   c) forming a refractory metal layer on said inter-layered insulating layer and in said hole;
   d) forming a conductive plug including a first refractory metal silicide layer and a first refractory metal nitride layer laminated on each other in said hole; and
   e) forming a multi-layered conductive structure including a second refractory metal nitride layer and a second refractory metal silicide layer laminated on each other on said refractory metal layer and said conductive plug by using a chemical vapor deposition.

7. The process as set forth in claim 6, in which said step c) comprises conformably forming said refractory metal layer over said inter-layered insulating layer; and step e) comprises the sub-steps of
   e-1) conformably forming said second refractory metal nitride layer over said inter-layered insulating layer, and
   e-2) conformably forming said first refractory metal silicide layer on said second refractory metal nitride layer.

8. The process as set forth in claim 7, in which said step e) further includes the sub-steps
   e-3) repeating said sub-steps e-1) and e-2) for forming more than one combination of said second refractory metal nitride layer and said second refractory metal silicide layer, and
   e-4) conformably forming a third refractory metal nitride layer on said more than one combination.

9. The process as set forth in claim 8, in which said first refractory metal nitride layer and said second refractory metal nitride layer are deposited at respective temperatures higher than a deposition temperature for said first refractory metal silicide layer.

10. The process as set forth in claim 6, in which said first and second refractory metal silicide layers and said first and second refractory metal nitride layers are formed of titanium silicide and titanium nitride, respectively.

11. The process as set forth in claim 6, in which said second refractory metal nitride is deposited a temperature higher than a deposition temperature for said second refractory metal silicide layer.

* * * * *